(12) United States Patent
Schloffer et al.

(10) Patent No.: US 9,657,395 B2
(45) Date of Patent: May 23, 2017

(54) OXIDATION-RESISTANT LAYER FOR TIAL MATERIALS AND METHOD FOR THE PRODUCTION THEREOF

(71) Applicant: MTU Aero Engines AG, Munich (DE)

(72) Inventors: Martin Schloffer, Munich (DE); Nanxi Zheng, Fuerstenfeldbruck (DE)

(73) Assignee: MTU AERO ENGINES AG, Munich (DE)

( * ) Notice: Subject to any disclaimer, the term of this patent is extended or adjusted under 35 U.S.C. 154(b) by 0 days.

(21) Appl. No.: 14/927,849

(22) Filed: Oct. 30, 2015

(65) Prior Publication Data
US 2016/0130704 A1    May 12, 2016

(30) Foreign Application Priority Data

Nov. 11, 2014    (EP) .................................... 14192639

(51) Int. Cl.
| | |
|---|---|
| B32B 15/20 | (2006.01) |
| C23C 28/00 | (2006.01) |
| C23C 14/02 | (2006.01) |
| C23C 14/34 | (2006.01) |
| C23C 14/16 | (2006.01) |
| C23C 14/08 | (2006.01) |
| C23C 16/06 | (2006.01) |
| C23C 16/02 | (2006.01) |
| C23C 14/30 | (2006.01) |
| C25D 11/04 | (2006.01) |
| C25D 11/18 | (2006.01) |
| C25D 11/26 | (2006.01) |

(52) U.S. Cl.
CPC ............ *C23C 28/36* (2013.01); *C23C 14/024* (2013.01); *C23C 14/025* (2013.01); *C23C 14/027* (2013.01); *C23C 14/083* (2013.01); *C23C 14/16* (2013.01); *C23C 14/30* (2013.01); *C23C 14/34* (2013.01); *C23C 16/029* (2013.01); *C23C 16/0272* (2013.01); *C23C 16/0281* (2013.01); *C23C 16/06* (2013.01); *C23C 28/321* (2013.01); *C23C 28/322* (2013.01); *C23C 28/323* (2013.01); *C23C 28/345* (2013.01); *C23C 28/347* (2013.01); *C23C 28/3455* (2013.01); *C25D 11/04* (2013.01); *C25D 11/18* (2013.01); *C25D 11/26* (2013.01)

(58) Field of Classification Search
None
See application file for complete search history.

(56) References Cited

U.S. PATENT DOCUMENTS

| | | | | |
|---|---|---|---|---|
| 8,663,814 B2 * | 3/2014 | Eichmann | ............... | F01D 5/288 |
| | | | | 428/432 |
| 2011/0299996 A1 * | 12/2011 | Uihlein | ................... | C23C 30/00 |
| | | | | 416/241 R |

FOREIGN PATENT DOCUMENTS

| | | | |
|---|---|---|---|
| CN | 103590008 | * | 2/2014 |
| DE | 102007060254 A1 | | 6/2009 |
| EP | 2071046 | * | 6/2009 |

* cited by examiner

*Primary Examiner* — Daniel J Schleis
(74) *Attorney, Agent, or Firm* — Abel Law Group, LLP

(57) ABSTRACT

The present invention relates to a protective layer for TiAl materials for affording protection against oxidation, said protective layer having a layer sequence which, proceeding from the inner side facing toward the TiAl material (1), has an inner aluminum oxide layer (5), a first gradient layer (6) comprising aluminum and a base metal with a base metal content increasing outward toward the surface side, a base metal layer (7), a second gradient layer (8) comprising aluminum and a base metal with an aluminum content increasing outward toward the surface side, and an outer aluminum oxide layer (9), and also to a method for the production thereof.

20 Claims, 1 Drawing Sheet

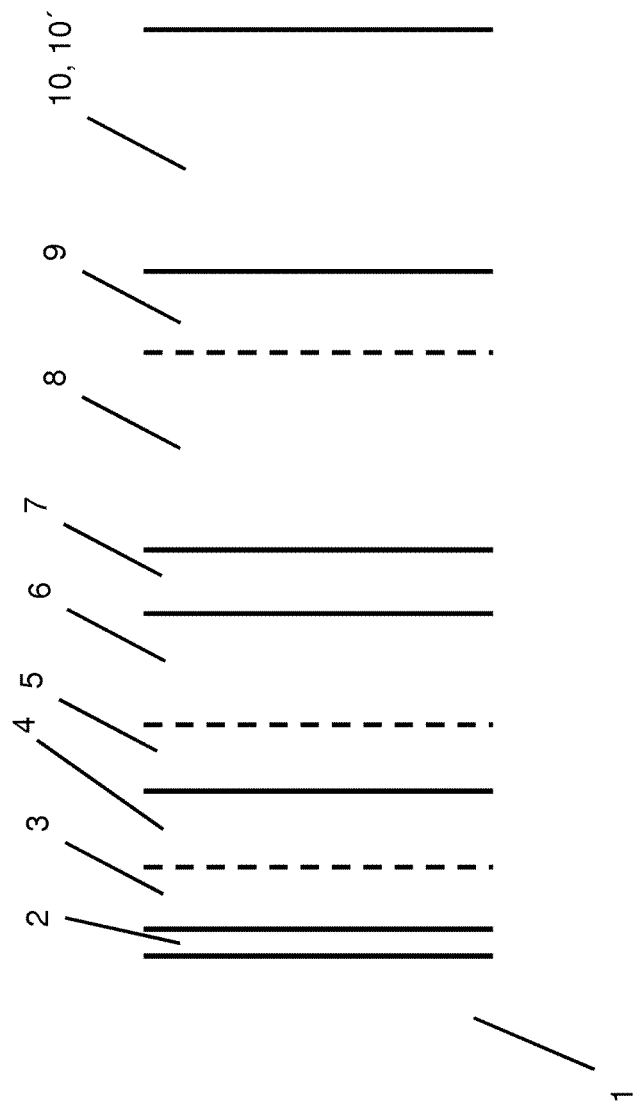

OXIDATION-RESISTANT LAYER FOR TIAL MATERIALS AND METHOD FOR THE PRODUCTION THEREOF

CROSS-REFERENCE TO RELATED APPLICATIONS

The present application claims priority under 35 U.S.C. §119 of European Patent Application No. 14192639.4, filed Nov. 11, 2014, the entire disclosure of which is expressly incorporated by reference herein.

BACKGROUND OF THE INVENTION

1. Field of the Invention

The present invention relates to a protective layer for TiAl materials for affording protection against oxidation and also to a method for producing a corresponding protective layer.

2. Discussion of Background Information

TiAl materials, which are known as metal alloys comprising the main constituents titanium and aluminum, e.g. titanium aluminide alloys, are materials of interest for internal combustion engines or turbomachines, such as stationary gas turbines or aero engines, since they can have high strengths and a good high-temperature stability given a low specific weight. Accordingly, materials of this type are already used in turbomachines. The operating temperature is limited, however, since the TiAl materials usually have inadequate oxidation resistance at relatively high temperatures of above 750° C.

Accordingly, attempts have already been made to develop oxidation-resistant layers for TiAl materials in order to make it possible to increase the corresponding operating temperatures. One example is given in DE 10 2007 060254 A1, the entire disclosure of which is incorporated by reference herein, which describes a platinum-based high-temperature protective layer for aluminum-rich titanium alloys and titanium aluminides.

However, the results which can be achieved with corresponding protective layers particularly at operating temperatures of up to 900° C. and above are still unsatisfactory.

In particular, in the case of known oxidation-resistant layers, various oxidation products may nevertheless form which prevent the formation of a readily adhering and slowly growing oxide layer, which would form protection against further oxidation and a diffusion barrier for oxygen. The diffusion of oxygen can lead to phase transformations in the marginal zone of the component and embrittlement of the base material, and this can impair the mechanical properties of the component. The embrittled marginal zone can continue to grow continuously during use at high temperatures, and therefore the reduction in strength and in particular fatigue strength continues, with the result that the service life of such components is limited.

Moreover, the application of the oxidation-resistant layer may likewise involve damaging oxidation of the TiAl material and diffusion of oxygen or of other constituents of the coating, and this can likewise lead to marginal embrittlement of the TiAl component.

In view of the foregoing, it would be desirable to have available a protective layer for TiAl materials for affording protection against oxidation and oxygen diffusion and also a method for the production thereof, which makes it possible to reliably protect the TiAl material against oxidation and marginal embrittlement at temperatures of above 750° C., in particular up to 900° C. At the same time, it should be possible for the layer to be applied reliably and easily, and the correspondingly coated components should afford long-lasting and reliable protection during operation.

SUMMARY OF THE INVENTION

The present invention provides a protective layer for TiAl materials for affording protection against oxidation. The protective layer has a layer sequence which, proceeding from the inner side facing toward the TiAl material, comprises an inner aluminum oxide layer, a first gradient layer comprising aluminum and a base metal with a base metal content increasing outward toward the surface side, a base metal layer, a second gradient layer comprising aluminum and a base metal with an aluminum content increasing outward toward the surface side, and an outer aluminum oxide layer.

In one aspect of the protective layer of the present invention, the transition from the inner aluminum oxide layer to the first gradient layer may be formed continuously with an aluminum oxide content which decreases outward from the inner side and an aluminum content which increases outward from the inner side and/or the transition from the second gradient layer to the outer aluminum oxide layer may be formed continuously with an aluminum oxide content which increases outward from the inner side and an aluminum content which decreases outward from the inner side.

In another aspect of the protective layer, the base metals of the first and second gradient layers and the base metal of the base metal layer may be selected from metals which are oxidation-resistant at temperatures of up to 900° C. For example, the base metals of the first and second gradient layers and the base metal of the base metal layer may comprise one or more elements, for example, exactly one element, selected from iron, cobalt, nickel, chromium, gold, platinum, iridium, palladium, osmium, silver, rhodium, ruthenium.

In yet another aspect of the protective layer, the protective layer may further comprise a thermal barrier layer and/or an abrasion-resistant layer at the surface. For example, the thermal barrier layer or the abrasion-resistant layer may comprise zirconium oxide or zirconium oxide partially stabilized with yttrium oxide and/or the abrasion-resistant layer may have a thickness of from 5 and 50 µm, in particular of about 10 µm, and/or the thermal barrier layer may have a thickness of greater than or equal to 150 µm.

In a still further aspect, the the protective layer may further comprise, arranged between the TiAl material and the inner aluminum oxide layer, a diffusion barrier layer with respect to the base metal or other constituents of the layer. For example, the diffusion barrier layer may be formed from coarse-grained aluminum oxide, the grain size being in the range of from 10 nm to 1 µm.

In another aspect, the protective layer may further comprise, arranged between the TiAl material and the inner aluminum oxide layer, an adhesion promoter layer, e.g., a corresponding layer formed from initially amorphous aluminum oxide, which crystallizes during a subsequent heat treatment and/or at elevated temperatures of more than 400° C. during use. For example, the adhesion promoter layer may be arranged on the inside, facing toward the TiAl material, and a diffusion barrier layer as set forth above may be arranged between the adhesion promoter layer and the inner aluminum oxide layer. In particular, the adhesion promoter layer and the diffusion barrier layer may be graduated layers with a proportion of crystalline aluminum oxide which increases from the inside outward.

The present invention also provides a method for producing a protective layer on a TiAl material, in particular a protective layer as set forth above. The method comprises depositing by physical vapor deposition (PVD) or chemical vapor deposition (CVD) from the inner side facing toward the TiAl material, an inner aluminum oxide layer, a first gradient layer comprising aluminum and a base metal with a base metal content increasing outward toward the surface side, a base metal layer, a second gradient layer comprising aluminum and a base metal with an aluminum content increasing outward toward the surface side, and an outer aluminum oxide layer.

In one aspect of the method, additionally an outer thermal barrier layer or abrasion-resistant layer may be deposited by electron beam evaporation or by being sprayed on and/or an inner diffusion barrier layer and/or adhesion promoter layer may be deposited by physical vapor deposition (PVD) or chemical vapor deposition (CVD).

In another aspect of the method, a pre-oxidation layer may be applied to the TiAl material by targeted oxidation at a temperature (T) of less than 600° C. and for a period of time (t) of less than 15 minutes, or may be formed by an electrolytic process in a thickness of thinner than 500 nm.

As set forth above, invention proposes providing a protective layer having a plurality of sub-layers, what is termed a multi-layer layer, which, in the outward direction beginning on the inner side facing toward the TiAl material, has an inner aluminum oxide layer, a first, inner gradient layer comprising aluminum and a base metal with a base metal content increasing outward toward the surface side, a base metal layer, a second, outer gradient layer comprising aluminum and a base metal with an aluminum content increasing outward toward the surface side, and an outer aluminum oxide layer.

Within the context of the present invention, a base metal is to be understood as meaning a metal which is added to the aluminum as an alloy constituent of the inner and outer gradient layers and forms the intermediate layer arranged between the gradient layers. The term "base metal" is selected merely to express this and should be understood only in this sense in the present disclosure without further limitation. In particular, this term does not mean that the base metal should represent a specific minimum proportion in a layer.

The base metal can be the same for all sub-layers.

The corresponding sub-layers of the protective layer can be deposited, for example, by means of physical vapor deposition (PVD) and/or chemical vapor deposition (CVD), it being possible for the deposition temperatures to be chosen to be so low that no phase transformations or diffusion processes with the diffusion of oxygen or other layer constituents into the TiAl material take place during the deposition of the layers. Moreover, the selected layer structure with the inner aluminum oxide layer prevents damage to the TiAl base material and the diffusion of metals or metal atoms from the multi-layer layer located thereabove during further use.

The layer structure with the first gradient layer and the second gradient layer and also the base metal layer incorporated therebetween furthermore provides an aluminum reservoir, and therefore aluminum can be delivered subsequently to the outer aluminum oxide layer for the slow growth of the aluminum oxide layer, without aluminum depletion occurring. In addition, the selected layer structure ensures that no oxygen can diffuse in, since it reacts in the protective layer to form aluminum oxide. The base metal layer ensures that mechanical stresses can be reduced.

Moreover, a temperature gradient can be formed by way of the layer structure with the inner aluminum oxide layer, the inner gradient layer, the base metal layer, the outer gradient layer and the outer aluminum oxide layer and also a thermal barrier layer optionally applied thereto and/or an abrasion-resistant layer and/or erosion-resistant layer, and therefore the inner regions are exposed to a lower temperature.

A protective layer of this type is suitable in particular for TiAl materials, TiAl materials being understood to mean all metal alloys whose main constituents are titanium and aluminum, i.e. whose quantitatively greatest constituents in terms of percent by weight are titanium and aluminum In particular, TiAl materials are to be understood as meaning intermetallic titanium aluminide alloys comprising various alloying elements, such as niobium, tungsten, chromium, zirconium or molybdenum.

The transition between the individual sub-layers of the protective layer can be formed as a whole in a continuous manner without sharp or step-like transitions, i.e. with graduated transitions, i.e. transitions in which the proportion of individual constituents slowly decreases or increases along the thickness direction of the layer. Thus, the transition from the inner aluminum oxide layer to the first gradient layer can be formed in a graduated manner in terms of the ratio between aluminum oxide and aluminum, such that the aluminum oxide proportion decreases continuously, whereas the aluminum proportion increases continuously, from the inside outward, with the aluminum proportion in turn then decreasing in the first, inner gradient layer in favor of the base metal proportion, until a pure base metal layer is present. Correspondingly, the transition from the outer, second gradient layer to the outer aluminum oxide layer can be configured in a correspondingly graduated manner, such that the aluminum proportion decreases continuously in the outward direction in favor of a higher aluminum oxide proportion.

The base metal of the first and second gradient layers and of the base metal layer may be iron, cobalt, nickel, chromium or a precious metal in the classical sense, i.e. gold or silver or a platinum metal, i.e. for example iridium, palladium, osmium, rhodium, ruthenium or platinum itself Moreover, the term "base metal" within the context of the present invention is also to be understood as meaning a metal which is oxidation-resistant at temperatures of up to 900° C., i.e. has a sufficiently low oxidation rate for the intended use. Suitable metals are therefore those which either virtually do not oxidize, such as the aforementioned precious metals, or oxidize only to a very small extent, such as iron, nickel, cobalt or chromium.

The protective layer can additionally have a thermal barrier layer and/or an abrasion-resistant layer or erosion-resistant layer at the surface.

The thermal barrier layer or the abrasion-resistant layer can be formed from zirconium oxide or from zirconium oxide partially stabilized with yttrium oxide.

A corresponding abrasion-resistant layer can have a thickness in the range of from about 5 μm to about 50 μm, in particular of about 10 μm, whereas the thermal barrier layer can have a greater thickness in the region of ≥150 μm.

The protective layer can furthermore comprise, arranged between the TiAl material and the inner aluminum oxide layer, a diffusion barrier layer, which in particular represents a barrier with respect to the diffusion of the base metal or other constituents of the protective layer into the base materials.

The diffusion barrier layer can be formed from coarse-grained, crystalline aluminum oxide, it being possible for the grain size to be in the range of from about 10 nm to about 1 μm.

Furthermore, it is possible for an adhesion promoter layer, which can be formed from amorphous aluminum oxide, to be provided between the TiAl material and the inner aluminum oxide layer.

In the presence of a diffusion barrier layer, the adhesion promoter layer can be arranged on the inside, facing toward the TiAl base material.

The diffusion barrier layer and the adhesion promoter layer can be formed as graduated layers, which can have a proportion of crystalline aluminum oxide which increases from the inside outward, such that a continuous transition between the adhesion promoter layer and the diffusion barrier layer can be formed.

Furthermore, a pre-oxidation layer can be formed directly on the TiAl base material, it being possible for this layer to be formed by oxidation of the TiAl material at low temperatures or in an electrolytic process, such that the base material is not exposed to any damage caused by oxygen diffusion and/or phase transformations and/or reactions with the coating elements. The thickness of the pre-oxidation layer may be in the range of up to about 500 nm and in particular up to about 200 nm and preferably up to about 50 nm. The pre-oxidation layer can additionally prevent a situation in which, during the subsequent application of individual sub-layers, oxygen diffuses into the TiAl material or other diffusion processes could impair the marginal microstructure of the TiAl material.

The inner aluminum oxide layer, the first gradient layer, the base metal layer, the second gradient layer and the outer aluminum oxide layer and also the adhesion promoter layer and the diffusion barrier layer can, for example, be deposited by physical vapor deposition (PVD) or chemical vapor deposition (CVD) or other suitable methods.

In particular, the individual layers can be deposited by sputtering.

BRIEF DESCRIPTION OF THE DRAWING

In the appended drawing

The FIGURE shows, in a purely schematic fashion, an illustration of the structure of a layer according to the invention in cross section.

DETAILED DESCRIPTION OF EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show details of the present invention in more detail than is necessary for the fundamental understanding of the present invention, the description in combination with the drawing making apparent to those of skill in the art how the several forms of the present invention may be embodied in practice.

Exemplary Embodiment

The FIGURE shows an exemplary embodiment of the present invention, the invention not being limited to this exemplary embodiment.

The FIGURE shows a cross section through an exemplary embodiment of a protective layer according to the present invention, wherein, proceeding from the TiAl material 1, a pre-oxidation layer 2, an adhesion promoter layer 3, a diffusion barrier layer 4, an inner aluminum oxide layer 5, a first, inner gradient layer 6, a base metal layer 7, a second, outer gradient layer 8, an outer aluminum oxide layer 9 and a thermal barrier layer 10 are shown.

The TiAl material 1 may be any desired metal alloy whose main constituents are titanium and aluminum, i.e. whose quantitatively greatest proportions in percent by weight are titanium and aluminum, for example intermetallic titanium aluminide alloys.

The pre-oxidation layer 2, which has a thickness of approximately up to 200 nm in the present exemplary embodiment, may be formed on the TiAl material 1 by, for example, an electrolytic process at low temperatures in the range of from about 10° C. to at most about 500° C.

According to the exemplary embodiment, an adhesion promoter layer formed from amorphous aluminum oxide ($Al_2O_3$) is applied to the pre-oxidation layer 2 by physical vapor deposition or chemical vapor deposition.

After the adhesion promoter layer 3, provision is made of a diffusion barrier layer 4, the latter serving as a diffusion barrier for the constituents provided in the subsequent layer structure, in particular a base metal. The diffusion barrier layer 4 is formed from crystalline aluminum oxide ($Al_2O_3$), which has a coarse-grained form with grain sizes in the range of from about 10 nm to about 1 μm.

In the exemplary embodiment shown, the adhesion promoter layer 3 and the diffusion barrier layer 4 are formed as a graduated layer having, together, a layer thickness of approximately 2 μm, with a gradient being formed over the layer thickness, along which the proportion of the amorphous aluminum oxide decreases outward in favor of the crystalline aluminum oxide.

In the same way, the inner aluminum oxide layer 5 is applied in such a way that there is a continuous transition to the inner, first gradient layer 6 in terms of the aluminum oxide/aluminum ratio. Correspondingly, the aluminum oxide proportion decreases in favor of an increasing aluminum proportion at the transition from the inner aluminum oxide layer 5 to the first gradient layer 6 formed from aluminum and platinum, until predominantly aluminum is present in the inner region of the gradient layer 6, the aluminum proportion of the first gradient layer 6 decreasing outward again within the first gradient layer in favor of an increasing platinum proportion. In the first, inner gradient layer 6, the layer is therefore depleted of aluminum, and enriched with platinum, from the inside outward, such that predominantly platinum is present at the base metal layer 7, which is formed as a pure platinum layer in the present exemplary embodiment, or the inner gradient layer 6 merges continuously into the base metal layer 7.

In the subsequent second, outer gradient layer 8, the proportion of platinum is reduced again in favor of aluminum, such that, at its outer edge, the second gradient layer 8 comprising platinum and aluminum has a predominant proportion of aluminum, which in turn merges continuously with an increasing aluminum oxide proportion into the outer aluminum oxide layer 9, such that the aluminum is gradually reduced in favor of the aluminum oxide, until a pure aluminum oxide layer 9 is present.

The layer thickness of the inner aluminum oxide layer 5 and of the first gradient layer together is approximately 3 μm, while the platinum layer 7 has a thickness of approximately 1 μm and the second, outer gradient layer 8 and the outer aluminum oxide layer 9 together have a thickness of approximately 7 μm.

The outwardly final thermal barrier layer 10 of the present embodiment is formed from zirconium oxide partially stabilized with yttrium oxide and has a thickness of ≥150 μm. The thermal barrier layer 10 can be applied by, for example, electron beam evaporation or plasma spraying.

In another embodiment, provision can be made not of a thermal barrier layer but of an abrasion-resistant layer 10', which can likewise be formed from zirconium oxide partially stabilized with yttrium oxide; however, the layer thickness is smaller and can vary, for example, in the region of approximately 10 μm.

The described layer structure provides an oxidation-resistant layer for TiAl materials which, even at high temperatures of above 750° C., not only prevents progressive oxidation, but also avoids a situation in which the TiAl base material experiences phase transformations and therefore embrittlement of the base material during application of the protective layer or as a result of thermal loading during operation. It can thereby be ensured that the base material neither undergoes excessive oxidation nor becomes embrittled in the marginal region, which could have a negative influence on the mechanical properties of the component.

Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

LIST OF REFERENCE NUMBERS

1 TiAl base material
2 Pre-oxidation layer
3 Adhesion promoter layer
4 Diffusion barrier layer
5 Inner aluminum oxide layer
6 First, inner gradient layer
7 Base metal layer
8 Second, outer gradient layer
9 Outer aluminum oxide layer
10 Thermal barrier layer
10' Abrasion-resistant layer

What is claimed is:

1. A protective layer for protecting a TiAl material against oxidation, wherein the protective layer has a layer sequence which, proceeding from an inner side facing toward the TiAl material, comprises an inner aluminum oxide layer, a first gradient layer comprising aluminum and a base metal with a base metal content increasing outward toward a surface side, a base metal layer, a second gradient layer comprising aluminum and a base metal with an aluminum content increasing outward toward the surface side, and an outer aluminum oxide layer.

2. The protective layer of claim 1, wherein a transition from the inner aluminum oxide layer to the first gradient layer is continuous, with an aluminum oxide content which decreases outward from the inner side and an aluminum content which increases outward from the inner side, and/or wherein a transition from the second gradient layer to the outer aluminum oxide layer is continuous, with an aluminum oxide content which increases outward from the inner side and an aluminum content which decreases outward from the inner side.

3. The protective layer of claim 1, wherein the base metal of the first and second gradient layers and the base metal of the base metal layer are selected from metals which are oxidation-resistant at temperatures of up to 900° C.

4. The protective layer of claim 1, wherein the base metal of the first and second gradient layers and the base metal of the base metal layer comprise one or more elements selected from iron, cobalt, nickel, chromium, gold, platinum, iridium, palladium, osmium, silver, rhodium, ruthenium.

5. The protective layer of claim 1, wherein the protective layer further comprises a thermal barrier layer and/or an abrasion-resistant layer at the surface.

6. The protective layer of claim 5, wherein the thermal barrier layer or the abrasion-resistant layer comprise zirconium oxide or zirconium oxide partially stabilized with yttrium oxide.

7. The protective layer of claim 5, wherein the abrasion-resistant layer has a thickness of from 5 μm to 50 μm.

8. The protective layer of claim 5, wherein the thermal barrier layer has a thickness of greater than or equal to about 150 μm.

9. The protective layer of claim 1, wherein the protective layer further comprises a diffusion barrier layer with respect to the base metal or other constituents of the layer arranged between the TiAl material and the inner aluminum oxide layer.

10. The protective layer of claim 9, wherein the diffusion barrier layer is formed from coarse-grained aluminum oxide, a grain size of the aluminum oxide being ranging from 10 nm to 1 μm.

11. The protective layer of claim 1, wherein the protective layer further comprises an adhesion promoter layer arranged between the TiAl material and the inner aluminum oxide layer.

12. The protective layer of claim 11, wherein the adhesion promoter layer is formed from initially amorphous aluminum oxide which crystallizes during a subsequent heat treatment and/or at elevated temperatures of more than 400° C. during use.

13. The protective layer of claim 11, wherein the adhesion promoter layer is arranged on the inside, facing toward the TiAl material, and a diffusion barrier layer is arranged between the adhesion promoter layer and the inner aluminum oxide layer.

14. The protective layer of claim 13, wherein the adhesion promoter layer and the diffusion barrier layer are formed as a graduated layer with a proportion of crystalline aluminum oxide which increases from the inside outward.

15. A TiAl material, wherein the material comprises the protective layer of claim 1.

16. The material of claim 15, wherein the material is a component of a stationary gas turbine or an aero engine.

17. The material of claim 15, wherein the material is a component of a turbomachine.

18. A method for producing a protective layer on a TiAl material, wherein the method comprises applying by physical vapor deposition (PVD) or chemical vapor deposition (CVD) and proceeding from an inner side facing toward the TiAl material, an inner aluminum oxide layer, a first gradient layer comprising aluminum and a base metal with a base metal content increasing outward toward the surface side, a base metal layer, a second gradient layer comprising aluminum and a base metal with an aluminum content increasing outward toward the surface side, and an outer aluminum oxide layer.

19. The method of claim 18, wherein additionally an outer thermal barrier layer or an abrasion-resistant layer is deposited by electron beam evaporation or by being sprayed on and/or an inner diffusion barrier layer and/or adhesion promoter layer are deposited by physical vapor deposition (PVD) or chemical vapor deposition (CVD).

20. The method of claim 18, wherein a pre-oxidation layer is applied to the TiAl material by targeted oxidation at a temperature of less than 600° C. and for a period of time of less than 15 minutes, or is formed by an electrolytic process in a thickness of less than 500 nm.

* * * * *